United States Patent [19]
Ishishita

[11] Patent Number: 5,585,775
[45] Date of Patent: Dec. 17, 1996

[54] INTEGRATED MAGNETORESISTIVE SENSOR

[75] Inventor: Kiyomi Ishishita, Tokyo, Japan

[73] Assignee: NEC Corporation, Tokyo, Japan

[21] Appl. No.: 228,427

[22] Filed: Apr. 15, 1994

[30] Foreign Application Priority Data

Apr. 21, 1993 [JP] Japan .................................. 5-117955

[51] Int. Cl.$^6$ .................................................. H01L 43/00
[52] U.S. Cl. .................. 338/32 R; 360/113; 324/207.21; 365/158
[58] Field of Search ............................ 338/32 SD, 32 R; 365/158, 173; 360/113; 324/252, 207.21

[56] References Cited

U.S. PATENT DOCUMENTS

| | | | |
|---|---|---|---|
| 5,134,533 | 7/1992 | Friedrich et al. | 338/32 R X |
| 5,159,513 | 10/1992 | Dieny et al. | 360/113 |
| 5,247,278 | 9/1993 | Pant et al. | 338/32 R |
| 5,432,734 | 7/1995 | Kawano et al. | 365/158 |

OTHER PUBLICATIONS

H. Konno et al.; "Integrated Ferromagnetic MR Sensors"; J.Appl.Phys. 69(8), 15 Apr. 1991, pp. 5933–5935.

*Primary Examiner*—Teresa J. Walberg
*Assistant Examiner*—Karl Easthom
*Attorney, Agent, or Firm*—Whitham, Curtis, Whitham & McGinn

[57] ABSTRACT

An integrated magnetoresistive sensor includes a magnetoresistive element portion in which a plurality of resistors, each having a plurality of magnetoresistive elements, are aligned in an array. The magnetoresistive elements each have a single layer ferromagnetic thin film. The resistors are arranged so that two adjacent resistors have orthogonal maximum detection directions, respectively, and the plurality of resistors are connected to constitute a electrical circuit having a pair of opposing nodes. A comparison circuit portion compares outputs from the two opposing nodes and outputs a comparison result. The ferromagnetic thin film has NiFeCo as a major component. One of the plurality of resistors may have a different resistance when no magnetic field is applied relative to the remaining resistors.

7 Claims, 6 Drawing Sheets

FIG. I
PRIOR ART

INTEGRATED MAGNETORESISTIVE SENSOR

BACKGROUND OF THE INVENTION

1. Field of the Invention

The present invention relates to an integrated magnetoresistive sensor and, more particularly, to an integrated magnetoresistive sensor used in rotational amount detection, position detection, and the like of an object.

2. Description of the Prior Art

In general, a magnetoresistive sensor is utilized in rotational amount detection by detecting a change in magnetic field in a flow rate meter of a hot water supply system, a speed meter of a vehicle, and the like, and is also utilized in position detection of a cylinder incorporated in a robot by a switching operation.

A conventional integrated magnetoresistive sensor is characterized by detection of a magnetic field which reciprocally moves in a predetermined direction, as described in, e.g., J. Appl. Phys. 69(8), Apr. 15, 1991.

FIG. 1 is an equivalent circuit diagram showing the arrangement of a conventional integrated magnetoresistive sensor. Referring to FIG. 1, a conventional magnetoresistive sensor includes a magnetoresistive element portion 1 consisting of four bridge connecting resistors 11 to 14, and a waveshaping processing portion 2 for waveshaping the output from the portion 1. Each resistor is form aligning a large number of magnetoresistive elements in an array, as shown in FIG. 2, and each magnetoresistive element consists of a ferromagnetic thin film (NiFe deposition film). A conductive film such as an Au film is formed on pattern returning portions (hatched portions) of the resistors 11 to 14.

In order to detect the direction of a magnetic field, the four resistors are arranged so that two adjacent resistors have orthogonal maximum detection directions, respectively. More specifically, when a magnetic field is applied in the direction of an arrow A, the resistances of the resistors 11 and 14 become maximum, and those of the resistors 12 and 13 become minimum. On the other hand, when a magnetic field is applied in the direction of an arrow B, the resistances of the resistors 12 and 13 become maximum, and those of the resistors 11 and 14 become minimum. In general, the direction of a magnetic field corresponding to a maximum resistance is called a direction of easy axis, and the direction of a magnetic field corresponding to a minimum resistance is called a direction of hard axis.

Assume that the resistors 11 to 14 have an electrical resistance of 10 kΩ or higher.

In the magnetoresistive element portion 1, a terminal 15 is connected to a power supply voltage Vcc, a terminal 16 is connected to ground level, a terminal 18 is connected to the plus input terminal (non-inverting input terminal) of a comparator, and a terminal 17 is connected to the minus input terminal (inverting input terminal) of the comparator. Referring to FIG. 1, the terminal 15 is connected to a power supply terminal 31, and the terminal 16 is connected to a ground terminal 33. The terminal 18 is connected to the plus input terminal (+) of a comparator 21 in the waveshaping processing portion 2, and the terminal 17 is connected to the minus input terminal (−) of the comparator 21.

The comparator 21 in the waveshaping processing portion 2 performs processing for calculating a potential difference between voltage values input to the plus and minus input terminals. The comparator 21 has two threshold levels. When the potential difference level exceeds the first threshold level, the comparator 21 outputs a low-level signal. On the other hand, when the potential difference level decreases below the second threshold level, the comparator 21 outputs a high-level signal. More specifically, the comparator 21 serves as a hysteresis comparator, and the potential difference between the two threshold levels is determined by a feedback resistor 22.

The feedback resistor 22 is normally connected to positively feed back the output from the comparator 21. In this arrangement, the feedback resistor 22 is connected between the plus input terminal of the comparator 21 and a terminal 34. This is to use the terminal 34 in an intermittent operation of this sensor so as to reduce power consumption when a battery is used as a power supply. More specifically, the previous output level is temporarily stored in an external memory (not shown), and the feedback amount to be supplied to the terminal 34 is changed in accordance with the stored level, thereby executing an operation continued from the previous operation. An access to the external memory (not shown) is made by a CPU (not shown). When the sensor is to be continuously operated, the feedback operation of the output from the comparator 21 to the plus input terminal thereof may be conducted. Note that the resistor 22 has a resistance of 1.5M Ω or higher.

An NPN transistor 24 is connected to the output terminal of the comparator 21, and its open collector serves as an output terminal 32. (Note that a set resistor 23 is connected between the comparator 21 and the ground terminal 33.)

The operation of the conventional integrated magnetoresistive sensor with the above-mentioned arrangement will be described below. Referring to FIG. 2, if the resistances of the resistors 11 to 14 are respectively represented by R1 to R4, and the angle defined between the direction of the applied magnetic field and the direction of the arrow B in FIG. 2 is represented by θ, changes in resistance in a rotary magnetic field exceeding a saturated magnetic field are respectively given by:

$$R1(\theta) = R1min \sin^2\theta + R1max \cos^2\theta$$
$$R2(\theta) = R2min \sin^2(\pi/2 - \theta) + R2max \cos^2(\pi/2 - \theta)$$
$$R3(\theta) = R3min \sin^2(\pi/2 - \theta) + R3max \cos^2(\pi/2 - \theta)$$
$$R4(\theta) = R4min \sin^2\theta + R4max \cos^2\theta$$

where Rnmax (n=1 to 4) is the resistance obtained upon magnetization in the direction of easy axis, and Rnmin (n=1 to 4) is the resistance obtained upon magnetization in the direction of hard axis. In general, the sensor is designed on the basis of the resistance obtained upon magnetization in the direction of easy axis.

Output voltages VIN1 and VIN2 from the minus and plus terminals of the comparator 21 are respectively given by:

$$VIN1 = Vcc * R3/(R1+R3)$$
$$VIN2 = Vcc * R4/(R2+R4)$$

where Vcc is the power supply voltage value between the power supply terminal 31 and the ground terminal 33.

The output level from the output terminal 32 of the comparator 21 changes from high level to low level when a potential difference VIN (=VIN2−VIN1) between the minus and plus terminals exceeds a sum (first threshold level) of an offset voltage VIO and a hysteresis width VHYS provided to the comparator 21; and it changes from low level to high level when the potential difference VIN decreases below VIO (second threshold level).

If it is assumed that Rnmax (n=1 to 4)=R0, and the maximum change amount of the resistance upon application of a magnetic field is represented by ΔR, a maximum change amount ΔV of the VIN is given by:

$$\Delta V = |VIN(\theta = 0) - VIN(\theta = \pi/2)| \quad (1)$$
$$= Vcc*\Delta R/R0$$
$$= Vcc*\Delta \rho/\rho$$

Note that equation (1) above is approximately established.

FIG. 3 shows the detection characteristics obtained when a rotary magnetic field is applied to the conventional integrated magnetoresistive sensor described above. FIG. 3 shows the potential difference VIN between the minus and plus terminals of the comparator 21 when the response frequency=200 Hz.

Referring to FIG. 3, VTH1 corresponds to the first threshold level, i.e., VIO+VHYS, and VTH2 corresponds to the second threshold level, i.e., VIO. A rectangular wave which goes to low level when VIN exceeds VTH1 or goes to high level when VIN decreases below VTH2 is output from the comparator 21. Note that the duty ratio of the rectangular wave is 50% in the characteristics shown in FIG. 3.

In the conventional integrated magnetoresistive sensor with the above-mentioned characteristics, upon applying a power supply voltage to the sensor, the resistances of the resistors 11 to 14 fluctuate and the initial output level from the comparator 21 is not stabilized. In order to solve this problem, the above-mentioned VTH2 (or VTH1) may be set to be relatively high (or low) to stabilize the initial output level. However, in order to maintain a duty ratio of 50%, since the difference between VTH1 and VTH2 cannot be changed, both VTH1 and VTH2 must be set to be relatively high (or low). Then, the value VTH1 may become higher than the maximum value of the waveform of VIN (or the value VTH2 may become lower than the minimum value of the waveform of VIN). In this case, the value VIN becomes always lower than VTH1 (or higher than VTH2), and the output level from the comparator is fixed at high level (or low level). Therefore, it is difficult to fix the initial level.

In the above-mentioned integrated magnetoresistive sensor, the variation amount of output voltage ΔV from the magneto-resistive element portion 1 is ΔV=Δρ/ρ× Vcc when the power supply voltage is Vcc, and depends on only the ratio Δρ/ρ of change in magnetoresistance. Since the ratio Δρ/ρ of change in magnetoresistance of the NiFe deposition film which forms the magnetoresistive element portion 1 as a ferromagnetic thin film is about 2 to 3%, if the output voltage ΔV is input to the comparator or the like without being amplified by, e.g., a preamplifier, the variation amount of the output voltage with respect to the detection level of the waveshaping processing portion 2 is undesirably small.

SUMMARY OF THE INVENTION

The objective present invention is to eliminate the conventional drawbacks, and has as its object to provide an integrated magnetoresistive sensor which has a large variation in output voltage.

It is another object of the present invention to provide an integrated magnetoresistive sensor which can easily fix the initial output level.

In order to achieve the above objects, according to a first aspect of the present invention, there is provided an integrated magnetoresistive sensor comprising a bipolar or MOS waveshaping processing circuit portion consisting of a diffusion layer, a P layer, an N layer, an Al electrode wiring layer, formed on an Si substrate, an insulating film of $Si_3N_4$ formed on the waveshaping processing circuit portion except for a connection pad portion, a magnetoresistive element portion which is formed in order of a conductor buffer layer consisting of Cr or Ti, a ferromagnetic thin film consisting of an NiFeCo alloy, and a conductor layer consisting of Au on the insulating film, and a protective film of $SiO_2$ formed on the magnetoresistive element portion except for the connection pad portion.

According to a the second aspect of the present invention, there is provided an integrated magnetoresistive sensor, wherein the NiFeCo alloy described in the first aspect comprises $Ni_{82}Fe_{12}Co_6$.

According to a third aspect of the present invention, there is provided an integrated magnetoresistive sensor, wherein thicknesses of the conductor buffer layer, the ferromagnetic thin film, and the conductor layer respectively fall within a range from several tens of Å to 150 Å, a range from 300 Å to 600 Å, and a range from 1 μm to 1.5 μm.

According to a fourth aspect of the present invention, there is provided an integrated magnetoresistive sensor comprising a magnetoresistive element portion in which a plurality of resistors, in each of which a large number of magnetoresistive elements each consisting of a ferromagnetic thin film are aligned in an array, are arranged to detect directions of respective magnetic fields, so that two adjacent resistors have orthogonal maximum detection directions, respectively, and the plurality of resistors are connected to constitute a single electrical circuit, and a comparison circuit portion for comparing outputs from two opposing nodes of the electrical circuit, and the sensor outputting a comparison result from the comparison circuit portion, wherein the ferromagnetic thin film comprises NiFeCo as a major component.

According to a fifth aspect of the present invention, there is provided an integrated magnetoresistive sensor, wherein the number of resistors described in the fourth aspect is four, and the four resistors are connected to a single bridge circuit.

According to the sixth aspect of the present invention, there is provided an integrated magnetoresistive sensor, wherein the ferromagnetic thin film described in the fourth or fifth aspect has an Ni composition ratio of 70 to 90 wt. %, an Fe composition ratio of 5 to 20 wt. %, and a Co composition ratio of 5 to 25 wt. %.

According to a seventh aspect of the present invention, there is provided an integrated magnetoresistive sensor, wherein one of the resistors described in any one of the fourth, fifth, and sixth aspects is defined to have a different resistance obtained when no magnetic field is applied, from those of the remaining resistors obtained when no magnetic field is applied.

As described above, according to the present invention, since an NiFeCo deposition film is used as the ferromagnetic thin film for forming the magnetoresistive element portion of the integrated magnetoresistive sensor, the variation in output voltage from the magnetoresistive element portion can be doubled at the same magnetic field sensitivity as that of the conventional sensor, and the yield of sensors can be improved.

Since the resistance of one of four magnetoresistive effect elements connected in a bridge circuit pattern is set to be different from those of other elements, the bridge circuit is unbalanced, and consequently, the initial output level can be easily fixed.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENT

Figure 4:
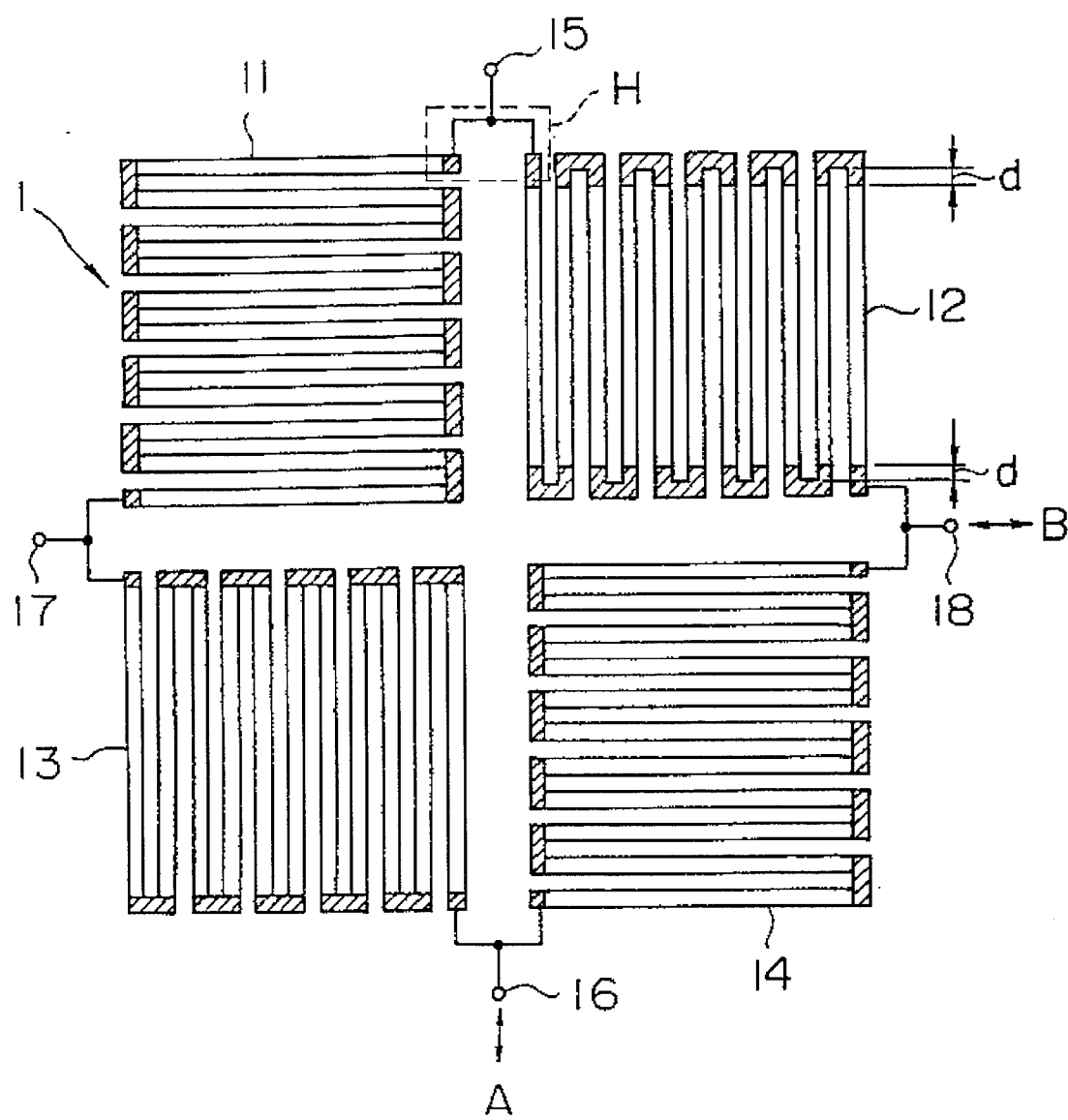
FIG. 4 is a schematic plan view showing the shape of a magnetoresistive element portion in an integrated magnetoresistive sensor according to an embodiment of the present invention.
Figure 5:
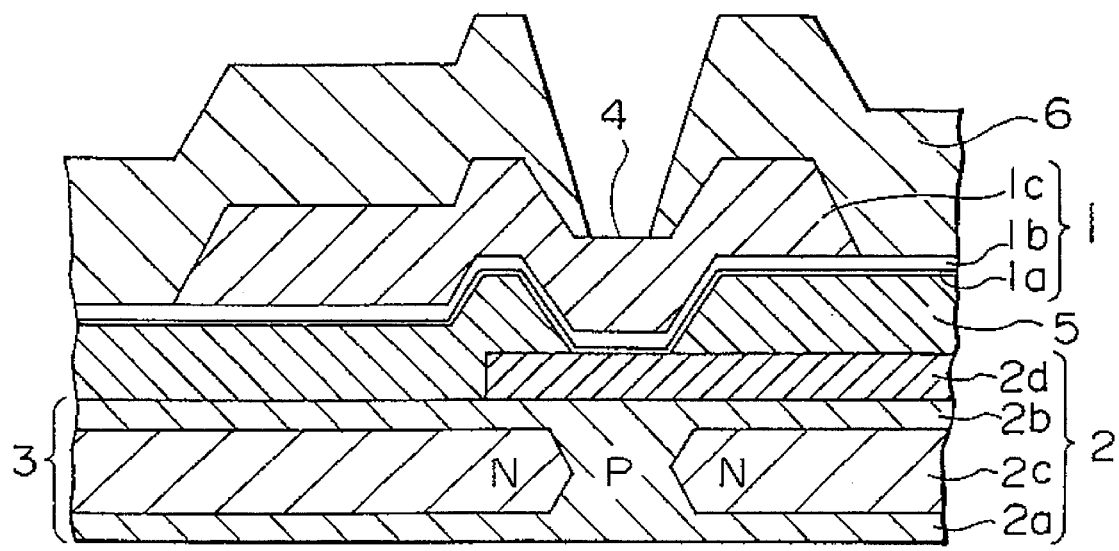
FIG. 5 is a sectional view showing the structure of a broken line portion H in FIG. 4.
Figure 6:
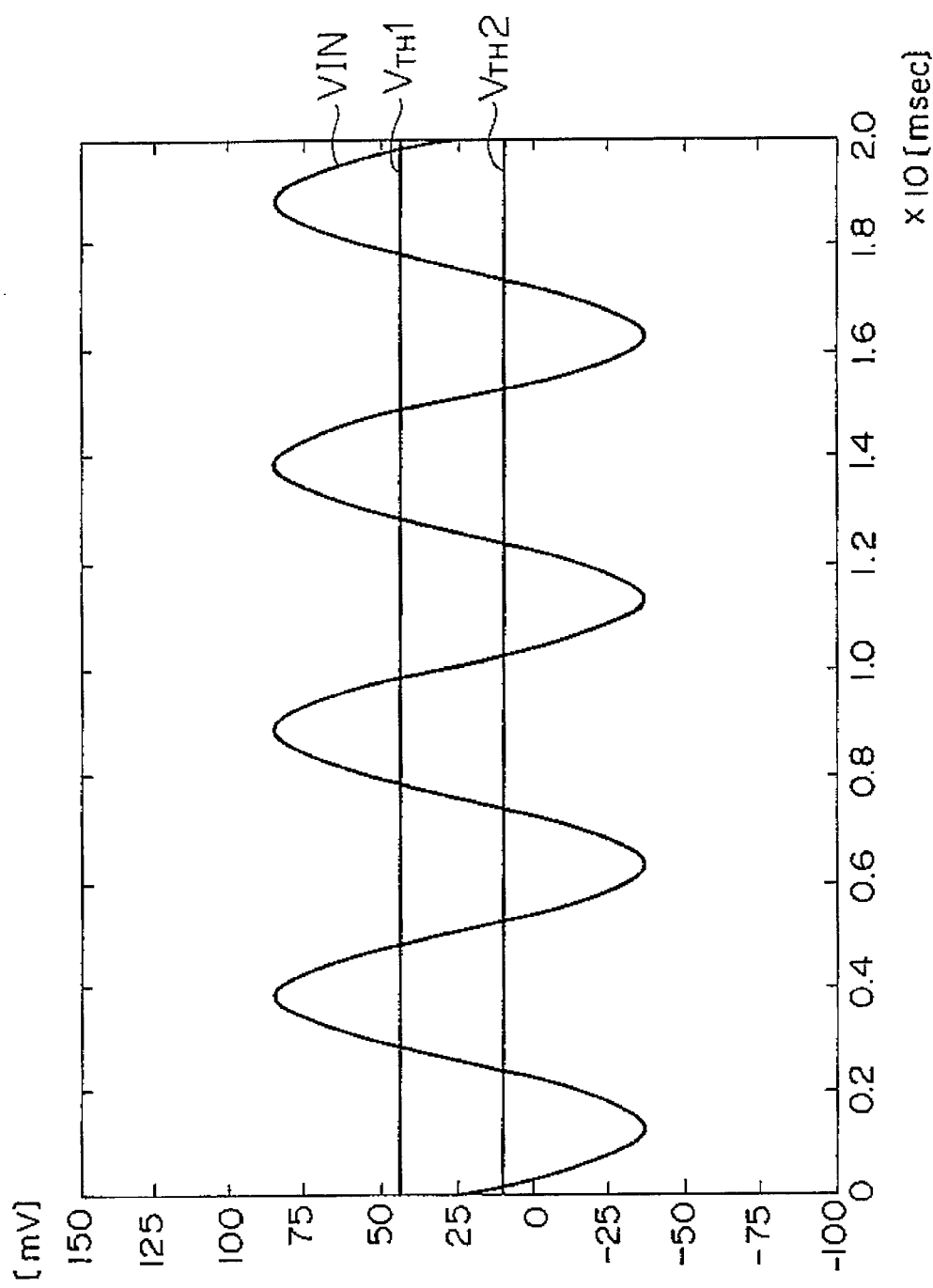
FIG. 6 is a graph showing the potential difference between the inverting and non-inverting input terminals of a comparator in the integrated magnetoresistive sensor according to the present invention.

The present invention will be described in more detail with reference to the preferred embodiment shown in the accompanying drawings (FIGS. 4 to 6).

FIG. 4 is a plan view showing an example of the shape of a magnetoresistive element portion in an integrated magnetoresistive sensor according to the present invention. Since the same reference numerals in FIG. 4 denote equivalent portions in FIG. 2, a detailed description thereof will be omitted to avoid a repetitive description.

A difference between a magnetoresistive element portion of this embodiment and the conventional one is that the ferromagnetic thin film of the former comprises NiFeCo. In particular, it is desirable that the Ni composition ratio be set to fall within a range from 70 to 90 wt. %, the Fe composition ratio be set to fall within a range from 5 to 20 wt. %, and the Co composition ratio be set to fall within a range from 5 to 25 wt. %. It is also desirable that the ferromagnetic thin film contain almost no impurities other than NiFeCo. However, mixing of impurities which are inevitably contained in the manufacturing processes is allowed to some extent.

Referring to FIG. 4, resistors 11 to 14 consist of the above-mentioned ferromagnetic thin film. A conductor film such as an Au film is formed on pattern returning portions (hatched portions) of the resistors 11 to 14 like in FIG. 2. However, unlike in FIG. 2, each returning portion of the resistor 12 is lengthened by a conductor film distance d as compared to those of the remaining resisters 11, 13, and 14. With this structure, the initial level is fixed since the potential at a terminal 18 becomes higher than that at a terminal 17 when no magnetic field is applied.

Figure 1:
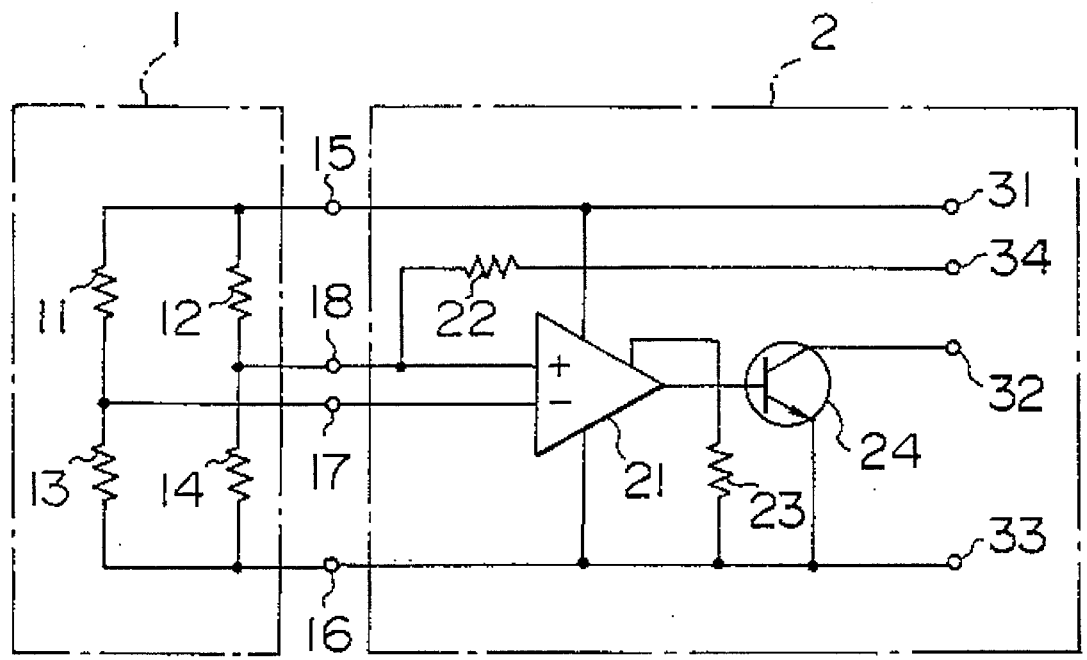
FIG. 1 is an equivalent circuit diagram showing the general arrangement of an integrated magnetoresistive sensor.
Figure 2:
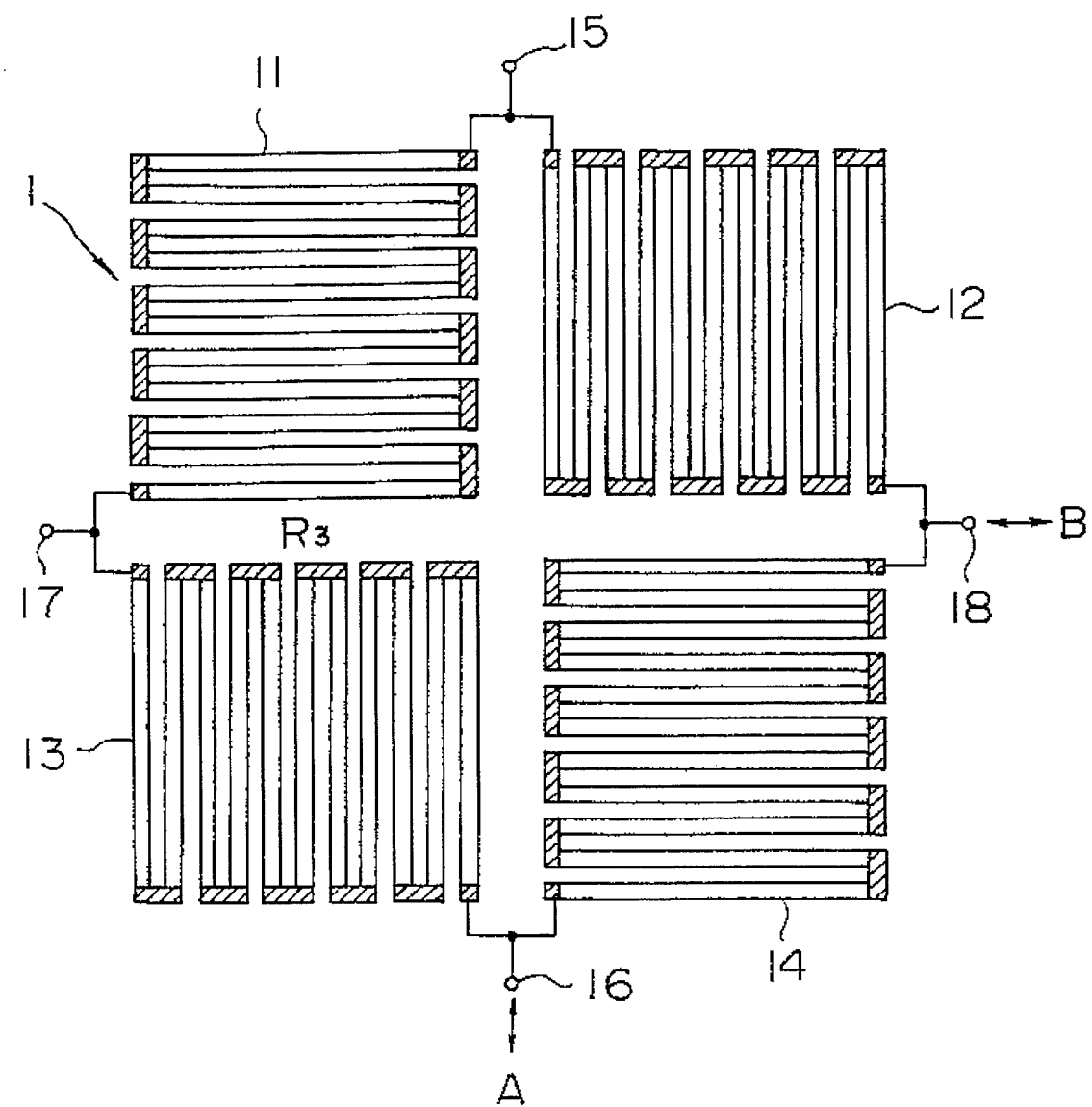
FIG. 2 is a schematic plan view showing the shape of a magnetoresistive element portion in the conventional integrated magnetoresistive sensor.

The four magnetic resistors 11 to 14 each have a resistance of 10 k$\Omega$ or higher, and are connected to constitute a bridge circuit. In a magnetoresistive element portion 1 comprising these four magnetic resistors 11 to 14, the correction is similar to a conventional sensor, in that a terminal 15 is connected to a power supply terminal 31, and a terminal 16 is connected to a ground terminal 33, as shown in FIG. 2. Furthermore, the terminal 17 is connected to the minus terminal of a comparator 21, and the terminal 18 is connected to the plus terminal of the comparator 21. The comparator 21 has two threshold levels. When the potential difference level exceeds the first threshold level, the comparator 21 outputs a low-level signal; when the potential difference level decreases below the second threshold level, the comparator 21 outputs a high-level signal, as in the sensor shown in FIG. 2.

The structure of the integrated magnetoresistive sensor according to the present invention, which has the magnetoresistive element portion shown in FIG. 4, will be described with reference to FIG. 5. FIG. 5 is a sectional view of a broken line portion H in FIG. 4. Referring to FIG. 5, a connection pad portion 4 is applied with a power supply voltage applied to the terminal 15 in FIG. 4, and is electrically connected to the terminal 15 via a bonding wire (not shown) or equivalent.

Referring to FIG. 5, the integrated magnetoresistive sensor of the present invention has the following structure: A bipolar or MOS waveshaping processing circuit portion 2 consisting of a diffusion layer 2a, a P layer 2b, an N layer 2c, an Al electrode wiring layer 2d, and the like is formed on an Si substrate 3. An $Si_3N_4$ insulating film 5 is formed on the waveshaping processing circuit portion 2, except for the connection pad portion 4. The magnetoresistive element portion 1 consisting of a conductor buffer layer 1a which has a thickness of about several tens to 150 Å and consists of Cr or Ti, a ferromagnetic thin film 1b which has a thickness of about 300 to 600 Å and consists of $Ni_{82}Fe_{12}Co_6$, and a conductor layer 1c which has a thickness of about 1 to 1.5 μm and consists of Au, is formed on the insulating film 5 on the waveshaping processing circuit portion 2. Furthermore, an $SiO_2$ protective film 6 is formed on the magnetoresistive element portion 1, except for the connection pad portion 4. As described above, in this embodiment, the magnetoresistive element portion 1 and the waveshaping processing circuit portion 2 are integrated on a single chip.

Referring back to FIG. 4, in the magnetoresistive element portion 1 of this embodiment, of the four magnetic resistors 11 to 14, the resistance of the resistor 12 obtained when no magnetic field is applied thereto is set to be different from those of other resistors 11, 13 and 14 obtained when no magnetic field is applied thereto. More specifically, the resistance of the resistor 12 is adjusted to be smaller than those of the remaining three resistors 11, 13 and 14 to unbalance the bridge circuit, thereby setting an initial offset voltage VOS. With this adjustment, the initial output level is fixed at a high level with while maintaining the duty ratio of 50%. The initial offset voltage VOS is given by:

$$VIO+VHYS>VOS>(VIO+VHYS)-\tfrac{1}{2}(\Delta V)$$

Note that VIO is about 0±10 mV, and VHYS is about 7 to 35 mV.

The conventional $Ni_{85}Fe_{15}$ deposition film has a ratio of change in magnetic resistance of about 2%. In particular, when the conventional sensor is used at a low power supply voltage (3 V or lower), no design margin of this sensor is assured, and it is difficult to fix the initial level with maintaining the duty ratio, as described above. In contrast to this, since the $Ni_{82}Fe_{12}Co_6$ deposition film has a ratio of change magnetic resistance of about 4%, the VIN maximum change amount is doubled, and a sufficient margin can be assured.

Furthermore, since the anisotropic magnetic field of the $Ni_{82}Fe_{12}Co_6$ deposition film is about 80 e, and is as small as that of the $Ni_{85}Fe_{15}$ deposition film, high sensitivity can be maintained.

FIG. 6 shows the detection characteristics obtained when a rotary magnetic field is applied to the integrated magnetoresistive sensor of this embodiment with the above-mentioned structure. FIG. 6 shows the potential difference VIN between the minus and plus terminals of the comparator 21 at a response frequency of 200 Hz like in FIG. 3.

Figure 3:
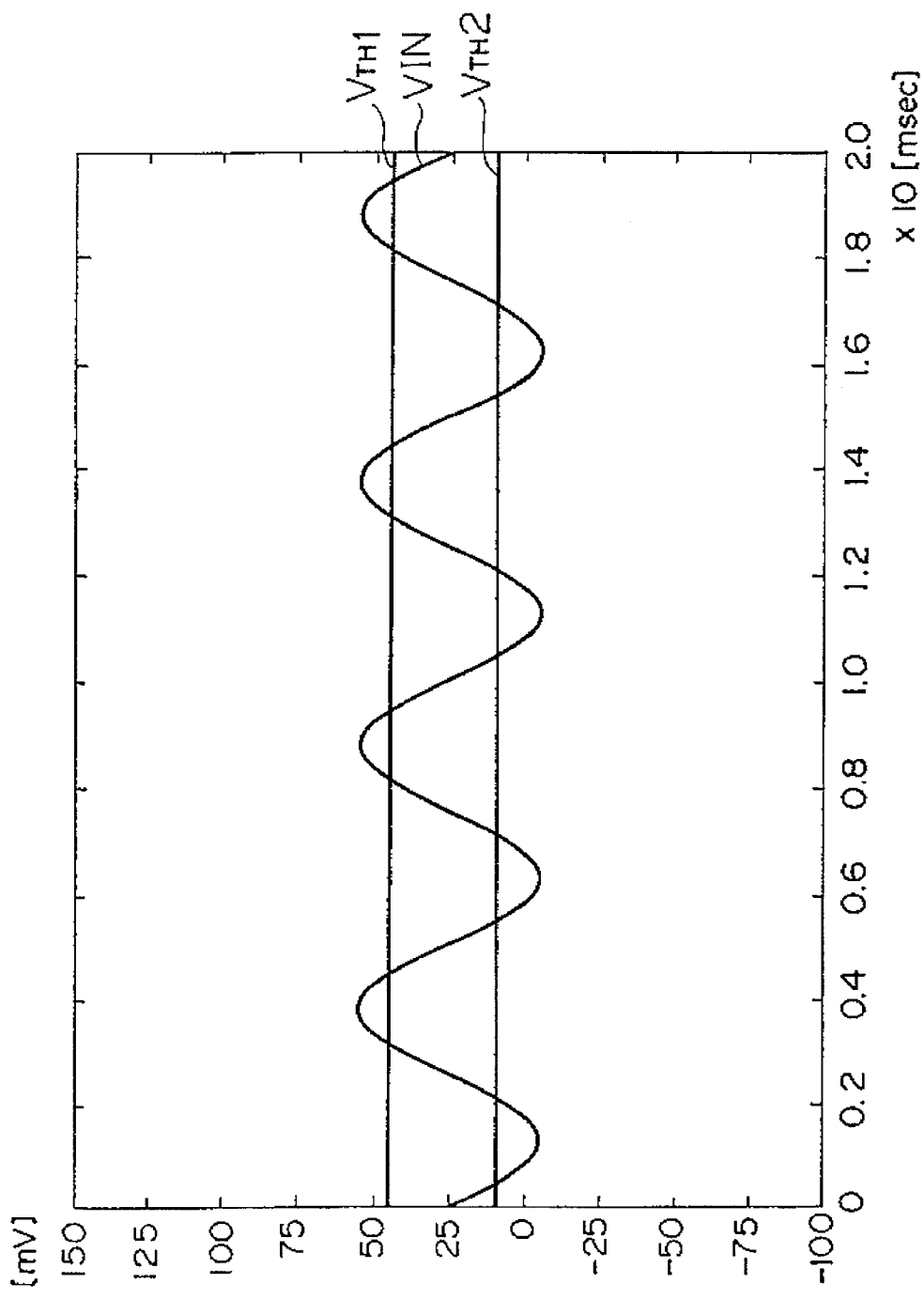
FIG. 3 is a graph showing the potential difference between the inverting and non-inverting input terminals of a comparator in the conventional integrated magnetoresistive sensor.

Since this embodiment adopts the NiFeCo thin film, the waveform amplitude is doubled as compared to the conventional characteristics shown in FIG. 3. Therefore, a sufficient design margin based on the temperature characteristics can be assured, and the yields of sensors can be improved.

When the VIN in FIG. 6 exceeds the first threshold level VTH1, a rectangular wave output from the comparator goes to a low level; when the VIN is lowered below the second threshold level VTH2, the rectangular wave goes to a high level, as in the conventional sensor. Even when the waveform amplitude is doubled, the duty ratio is maintained to be 50%.

What we claim is:

1. An integrated magnetoresistive sensor comprising:

a plurality of resistors, each comprising a plurality of magnetoresistive elements, each of said elements having a ferromagnetic thin film, said ferromagnetic thin film having NiFeCo as a major component, said elements aligned in an array in a direction associated with a maximum detection direction, said resistors arranged so that two adjacent resistors have said magnetoresistive elements aligned in different maximum detection directions, and said plurality of resistors connected to form an electrical circuit having a pair of opposing nodes;

means connected to each of said nodes for comparing their respective voltages, and means for outputting a signal representing said comparison, wherein one of said plurality of resistors has a first resistance measured within a zero magnitude magnetic field, and the remaining of said plurality resistors have a second resistance measured within a zero magnitude magnetic field.

2. An integrated magnetoresistive sensor comprising:

four resistors, each comprising a plurality of magnetoresistive elements, each of said elements having a ferromagnetic thin film, said ferromagnetic thin film having NiFeCo as a major component, said elements aligned in an array in a direction associated with a maximum detection direction, said resistors arranged so that two adjacent resistors have said magnetoresistive elements aligned in different maximum detection directions, and said four resistors connected to form a bridge circuit having a pair of opposing nodes;

means connected to each of said nodes for comparing their respective voltages, and means for outputting a signal representing said comparison;

wherein one of said four resistors has a first resistance measured within a zero magnitude magnetic field, and the remaining of said plurality resistors have a second resistance measured within a zero magnitude magnetic field.

3. An integrated magnetoresistive sensor comprising:

a plurality of resistors, each comprising a plurality of magnetoresistive elements, each of said elements having a ferromagnetic thin film, said elements aligned in an array in a direction perpendicular associated with a maximum detection direction, said resistors arranged so that two adjacent resistors have said magnetoresistive elements aligned in different maximum detection directions, and said plurality of resistors connected to form an electrical circuit having a pair of opposing nodes;

means connected to each of said nodes for comparing their respective voltages, and means for outputting a signal representing said comparison, wherein said ferromagnetic thin film has an Ni composition ratio of 70 to 90 wt. %, an Fe composition ratio of 5 to 20 wt. %, and a Co composition ratio of 5 to 25 wt. %.

4. A sensor according to claim 3, wherein one of said plurality of resistors has a first resistance measured within a zero magnitude magnetic field, and the remaining of said plurality resistors have a second resistance measured within a zero magnitude magnetic field.

5. An integrated magnetresistive sensor comprising:

a waveshaping processing circuit having a diffusion layer, a P layer, an N layer, an electrode wiring layer, and connection pads arranged in order on an Si substrate;

an insulating film formed on said waveshaping processing circuit except for said connection pads, a magnetoresistive element comprising a conductor buffer layer, a ferromagnetic thin film consisting of an NiFeCo alloy, and a conductor layer on said insulating film; and a protective film formed on said magnetoresistive element except for said connection pads, wherein said NiFeCo alloy includes $Ni_{82}Fe_{12}Co_6$.

6. An integrated magnetoresistive sensor comprising:

four resistors, each comprising a plurality of magnetoresistive elements, each of said elements having a ferromagnetic thin film, said elements aligned in an array in a direction associated with a maximum detection direction, said resistors arranged so that two adjacent resistors have said magnetoresistive elements aligned in different maximum detection directions, and said four resistors connected to form a bridge circuit having a pair of opposing nodes;

means connected to each of said nodes for comparing their respective voltages, and means for outputting a signal representing said comparison;

wherein said ferromagnetic thin film has an Ni composition ratio of 70 to 90 wt. %, an Fe composition ratio of 5 to 20 wt. %, and a Co composition ratio of 5 to 25 wt. %.

7. A sensor according to claim 6, wherein one of said four resistors has a first resistance measured within a zero magnitude magnetic field, and the remaining of said plurality resistors have a second resistance measured within a zero magnitude magnetic field.

* * * * *